(12) United States Patent
Lee et al.

(10) Patent No.: US 8,822,335 B2
(45) Date of Patent: Sep. 2, 2014

(54) SEMICONDUCTOR DEVICE WITH AIR GAP AND METHOD FOR FABRICATING THE SAME

(71) Applicant: SK hynix Inc., Gyeonggi-do (KR)

(72) Inventors: Nam-Yeal Lee, Gyeonggi-do (KR); Seung-Jin Yeom, Gyeonggi-do (KR); Sung-Won Lim, Gyeonggi-do (KR); Seung-Hee Hong, Gyeonggi-do (KR); Hyo-Seok Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/843,794

(22) Filed: Mar. 15, 2013

(65) Prior Publication Data

US 2014/0179101 A1    Jun. 26, 2014

(30) Foreign Application Priority Data

Dec. 26, 2012    (KR) .......................... 10-2012-0153830

(51) Int. Cl.
*H01L 21/44*    (2006.01)

(52) U.S. Cl.
USPC .......................................................... 438/666

(58) Field of Classification Search
CPC ..... H01L 23/48; H01L 23/352; H01L 21/336; H01L 21/00; H01L 217/108; H01L 21/8238
USPC ................. 438/619, 421–422, 319, 411–412; 257/302, 314, 316, 773
See application file for complete search history.

(56) References Cited

U.S. PATENT DOCUMENTS

| | | | |
|---|---|---|---|
| 5,516,720 A * | 5/1996 | Lur et al. ...................... | 438/422 |
| 5,543,362 A | 8/1996 | Wu | |
| 6,020,250 A * | 2/2000 | Kenney ......................... | 438/422 |
| 6,124,179 A * | 9/2000 | Adamic, Jr. .................. | 438/309 |
| 6,190,996 B1 | 2/2001 | Mouli et al. | |
| 6,238,987 B1 * | 5/2001 | Lee ............................... | 438/305 |
| 7,994,046 B2 * | 8/2011 | Jeng .............................. | 438/619 |
| 8,198,189 B2 * | 6/2012 | Kim et al. ..................... | 438/619 |
| 8,399,335 B2 * | 3/2013 | Huisinga et al. ............. | 438/421 |
| 8,421,166 B2 * | 4/2013 | Chi et al. ...................... | 257/410 |
| 2011/0309430 A1 * | 12/2011 | Purayath et al. .............. | 257/321 |
| 2012/0156855 A1 * | 6/2012 | Sim ............................... | 438/421 |
| 2012/0193696 A1 | 8/2012 | Fukushima | |
| 2012/0241838 A1 * | 9/2012 | Nagashima et al. .......... | 257/316 |
| 2013/0049209 A1 * | 2/2013 | Yeom et al. ................... | 257/773 |

FOREIGN PATENT DOCUMENTS

| | | |
|---|---|---|
| KR | 10-2002-0094977 | 12/2002 |
| KR | 10-2011-0098519 | 9/2011 |

* cited by examiner

*Primary Examiner* — Yuanda Zhang
*Assistant Examiner* — Sheikh Maruf
(74) *Attorney, Agent, or Firm* — IP & T Group LLP

(57) ABSTRACT

A method for fabricating a semiconductor device includes forming a semiconductor structure having an open portion over a substrate, forming a sacrificial spacer on sidewalls of the open portion, forming a recessed first plug in the open portion, forming an air gap by removing the sacrificial spacer, forming a capping layer to expose the top surface of the recessed first plug and to cap the air gap, forming a protective layer over the capping layer and the recessed first plug, forming an ohmic contact layer over the protective layer, and forming a second plug over the ohmic contact layer.

18 Claims, 14 Drawing Sheets

SEMICONDUCTOR DEVICE WITH AIR GAP AND METHOD FOR FABRICATING THE SAME

CROSS-REFERENCE TO RELATED APPLICATIONS

The present application claims priority of Korean Patent Application No. 10-2012-0153830, filed on Dec. 26, 2012, which is incorporated herein by reference in its entirety.

BACKGROUND

1. Field

Exemplary embodiments of the present invention relate to a semiconductor device, and more particularly, to a semiconductor device with an air gap and a method for fabricating the same.

2. Description of the Related Art

In general, a semiconductor device includes a second conductive structure formed with an insulation layer provided between a plurality of first conductive structures. For example, the first conductive structure may include a gate, a bit line, a metal interconnection and the like, and the second conductive structure may include a contact plug, a storage node contact plug, a bit line contact plug, a via and the like.

With high integration of the semiconductor device, a distance between the first and second conductive structures has gradually decreased. Accordingly, parasitic capacitance between the first and second conductive structures is increased. With the increase of parasitic capacitance, the operation speed of the semiconductor device is reduced, and the refresh characteristic of the semiconductor device is degraded.

In order to reduce parasitic capacitance, the dielectric constant of the insulation layer may be reduced. In general, an insulation layer used in a semiconductor device may include silicon oxide and silicon nitride. The silicon oxide has a dielectric constant of about 4, and the silicon nitride has a dielectric constant of about 7.

Since the silicon oxide and the silicon nitride have high dielectric constants, they have a limitation in reducing parasitic capacitance. Recently, materials having relatively low dielectric constants have been developed, but the dielectric constants thereof may be not so low.

SUMMARY

Various exemplary embodiments of the present invention are directed to a semiconductor device that may reduce parasitic capacitance between adjacent conductive structures, and a method for fabricating the same.

In an exemplary embodiment of the present invention, a method for fabricating a semiconductor device includes forming a semiconductor structure having an open portion over a substrate; forming a sacrificial spacer on sidewalls of the open portion; forming a recessed first plug in the open portion; forming an air gap by removing the sacrificial spacer; forming a capping layer to expose a top surface of the recessed first plug and to cap the air gap; forming a protective layer over the capping layer and the recessed first plug; forming an ohmic contact layer over the protective layer; and forming a second plug over the ohmic contact layer.

In another exemplary embodiment of the present invention, a method for fabricating a semiconductor device includes forming a plurality of bit line structures over a substrate; forming a storage node contact hole between the bit line structures; forming a sacrificial spacer on sidewalls of the storage node contact hole; forming a recessed first storage node contact plug in the storage node contact hole; forming an air gap by removing the sacrificial spacer; forming oxide by oxidizing the surface of the recessed first storage node contact plug; etching the oxide to expose a top surface of the recessed first storage node contact plug, and forming a capping layer to cap the air gap; forming a protective layer over the capping layer and the first storage node contact plug; forming an ohmic contact layer over the protective layer; and forming a second storage node contact plug over the ohmic contact layer.

In still another exemplary embodiment of the present invention, a method for fabricating a semiconductor device includes forming a semiconductor structure having an open portion exposing a portion of a substrate; forming a sacrificial spacer on sidewalls of the semiconductor structure; forming a recessed first plug in the open portion; forming an air gap by removing the sacrificial spacer; forming a capping layer to cap the air gap; forming a protective layer over the capping layer and the recessed first plug; and forming a second plug over the protective layer.

In still another exemplary embodiment of the present invention, a semiconductor device includes a plurality of bit line structures formed over a substrate; a storage node contact hole formed to expose sidewalls of the bit line structures; a recessed first storage contact plug formed in the storage node contact hole; an air gap formed between the sidewalls of the bit line structures and the recessed first storage node contact plug; a capping layer capping the air gap; a protective layer formed over the capping layer and the recessed first storage node contact plug; an ohmic contact layer formed over the protective layer; and a second storage node contact plug formed over the ohmic contact layer.

The capping layer may comprise oxide of the recessed first storage node contact plug. The ohmic contact layer may comprise metal silicide, and the protective layer comprises polysilicon. The recessed first storage node contact plug may comprise polysilicon, and the second storage node contact plug comprises tungsten.

In still another exemplary embodiment of the present invention, a semiconductor device includes a semiconductor structure formed over a substrate and having an open portion; a silicon plug formed in the open portion; an air gap formed between the silicon plug and sidewalls of the semiconductor structure; a capping layer exposing a top surface of the silicon plug and capping the air gap; a protective layer including a silicon layer, formed over the capping layer and the silicon plug; an ohmic contact layer including metal silicide, formed over the protective layer; and a metal plug formed over the ohmic contact layer.

The capping layer may comprise silicon oxide obtained by oxidizing the silicon plug. The ohmic contact layer comprises cobalt silicide.

DETAILED DESCRIPTION

Figure 1:
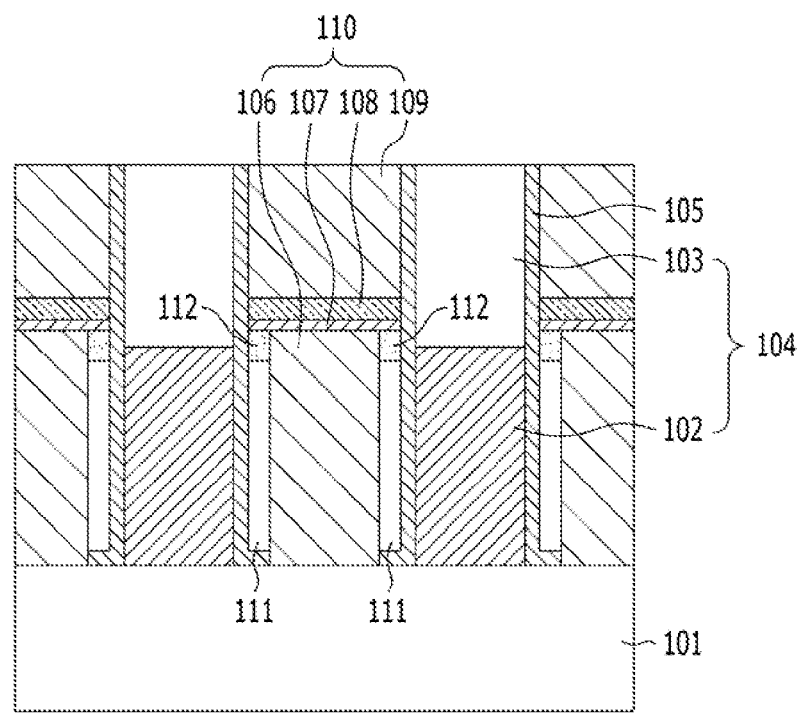
FIG. 1 is a cross sectional view illustrating a portion of a semiconductor device in accordance with an embodiment of the present invention.

Various exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is cross sectional view illustrating a portion of a semiconductor device in accordance with an embodiment of the present invention.

Referring to FIG. 1, a plurality of semiconductor structures are formed over a substrate 101. The semiconductor structure may include a conductive structure. The conductive structure may include a first conductive structure 104 and a second conductive structure 110. Between the first and second conductive 104 and 110, an air gap 111 may be formed. A capping layer 112 may be formed over the air gap 111.

The first conductive structure 104 may include a first conductive layer 102. The first conductive structure 104 may have a stacked structure of the first conductive layer 102 and a hard mask layer 103. The first conductive layer 102 may include a silicon-containing layer or a metal-containing layer. The first conductive layer 102 may be formed by stacking a silicon-containing layer and a metal-containing layer. The first conductive layer 102 may include polysilicon, metal, metal nitride, metal silicide or the like. The first conductive layer 102 may be formed by stacking polysilicon and metal. The metal may include tungsten. The hard mask layer 103 may include an insulator. The hard mask layer 103 may include oxide or nitride.

Any one of the first and second conductive structures 104 and 110 may have a line shape extended in any one direction. The other of the first and second conductive structures 104 and 110 may have a plug shape. For example, the first conductive structure 104 may include a line-shaped structure, and the second conductive structure 110 may include a plug-shaped structure. The first conductive structures 104 may be regularly arranged at even intervals from each other over the substrate 101. The second conductive structure 110 may be formed in an open portion formed between the first conductive structures 104. The open portion may include a contact hole and the like.

The second conductive structure 110 may include a recessed second conductive layer 106 between the first conductive structures 104. The second conductive structure 110 may have a stacked structure including the second conductive layer 106, a protective layer 107, an ohmic contact layer 108, and a third conductive layer 109. The second conductive layer 106 and the protective layer 107 may include a silicon-containing layer. The second conductive layer 106 and the protective layer 107 may include polysilicon. The ohmic contact layer 108 and the third conductive layer 109 may include a metal-containing layer. The ohmic contact layer 108 may include metal silicide such as cobalt silicide. The third conductive layer 109 may include metal, metal silicide, metal nitride or the like. The third conductive layer 109 may have a stacked structure of a barrier layer and a metal layer. The third conductive layer 109 may be formed by stacking titanium nitride and tungsten.

The capping layer 112 may be formed in such a shape as to cap the air gap 111. The capping layer 112 may include oxide of the second conductive layer 106. In particular, the capping layer 112 may include plasma oxide of the second conductive layer 106. The capping layer 112 may include silicon oxide.

A spacer 105 may be formed over both sidewalls of the first conductive structure 104. The spacer 105 may include an insulator. The spacer 105 may include oxide or nitride. The spacer 105 and the air gap 111 may serve to insulate the first and second conductive structures 104 and 110 from each other.

Any one of the first and second conductive structures 104 and 110 may include a gate and a bit line. The other of the first and second conductive structures 104 and 110 may include a contact plug. The contact plug may include a storage node contact plug, a landing plug and the like. In FIG. 1, the first conductive layer 102 of the first conductive structure 104 may include a bit line, and the second conductive structure 110 may include a storage node contact plug. Therefore, the air gap 111 may be formed between the bit line and the storage node contact plug. The second conductive layer 106 may become a first plug, and the third conductive layer 109 may become a second plug. Since the first plug includes a silicon-containing layer and the second plug includes a metal-containing layer, the storage node contact plug may have a stacked structure of a silicon-containing plug and a metal-containing plug.

Referring to FIG. 1, the air gap 111 is formed between the first and second conductive structures 104 and 110. The air gap 111 having a dielectric constant of 1 reduces parasitic capacitance between the first and second conductive structures 104 and 110. Furthermore, the top of the air gap 111 is sealed by the capping layer 112.

The capping layer 112 to cap the air gap 111 is formed of oxide obtained by oxidizing the second conductive layer 106. The protective layer 107 is formed over the capping layer 112 and the second conductive layer 106. Accordingly, the protective layer 107 may protect the capping layer 112 to stably cap the air gap 111. The protective layer 107 is formed of a material that may be converted into silicide (hereinafter, referred to as 'silicidable material'), and the ohmic contact layer 108 is formed over the protective layer 107, thereby increasing the formation area of the ohmic contact layer 108.

In the semiconductor device of FIG. 1, the protective layer 107 prevents the capping layer 112 from being attacked. Therefore, the air gap 29 may be stably implemented. Furthermore, the ohmic contact layer 108 is formed over the protective layer 107, thereby improving contact resistance.

Figure 2A:
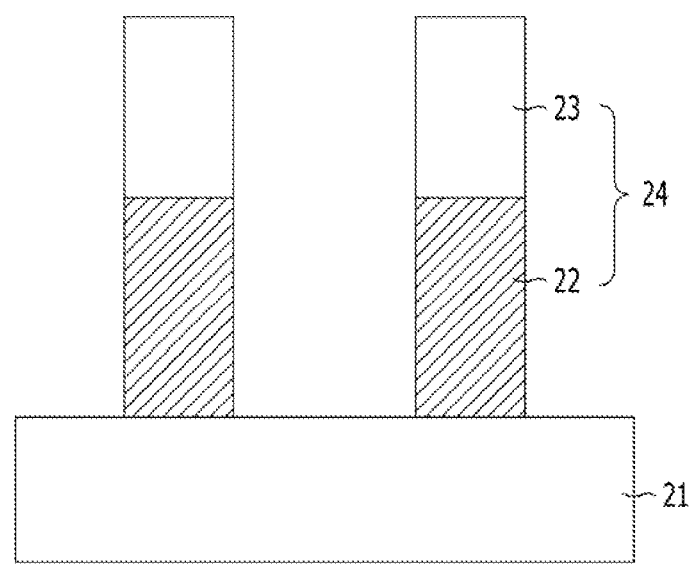
FIGS. 2A to 2O are cross sectional views illustrating a method for fabricating the semiconductor device in accordance with an embodiment of the present invention.
Figure 2B:
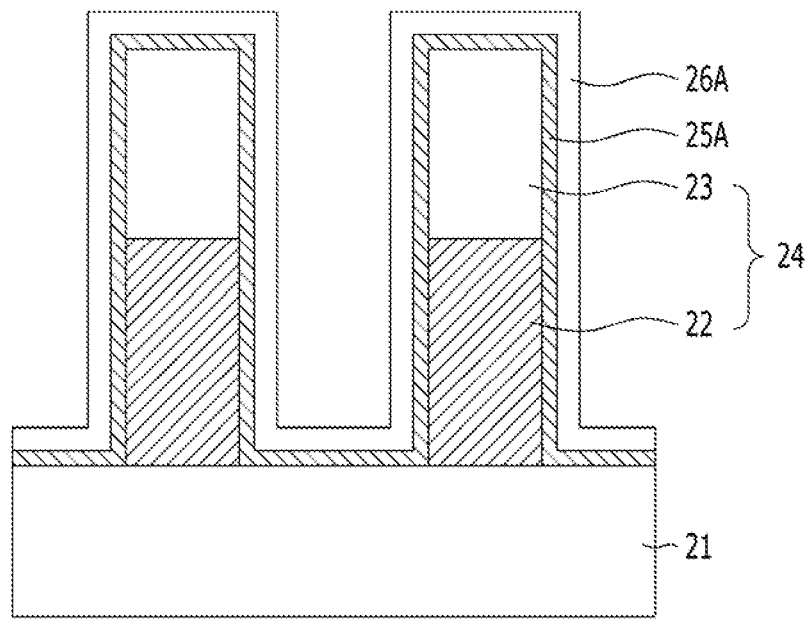
Figure 2C:
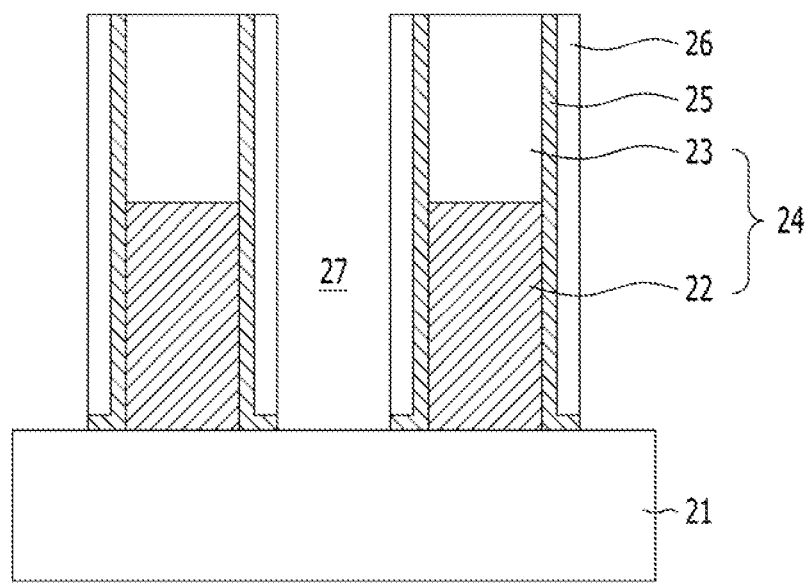
Figure 2D:
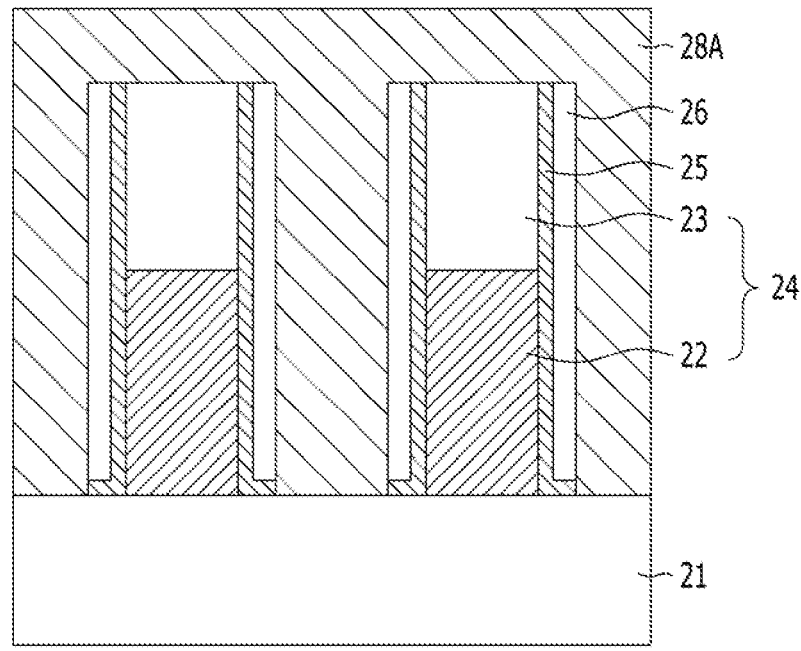
Figure 2E:
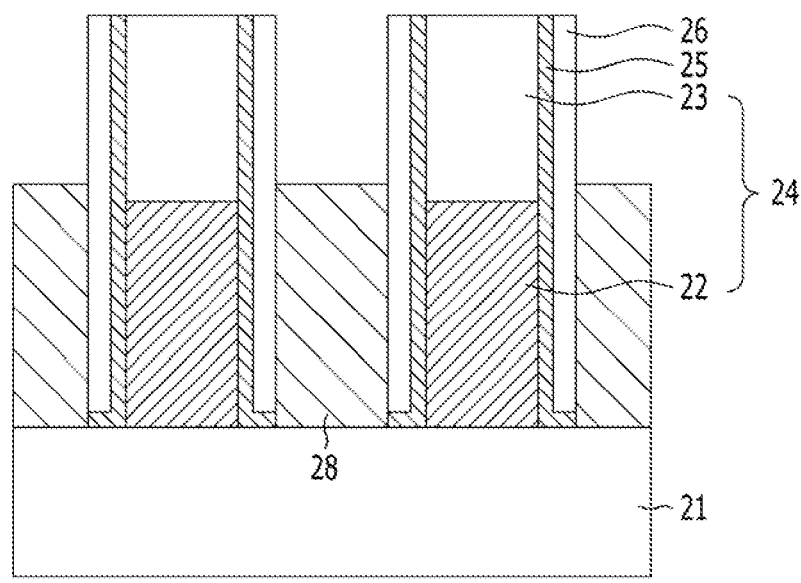
Figure 2F:
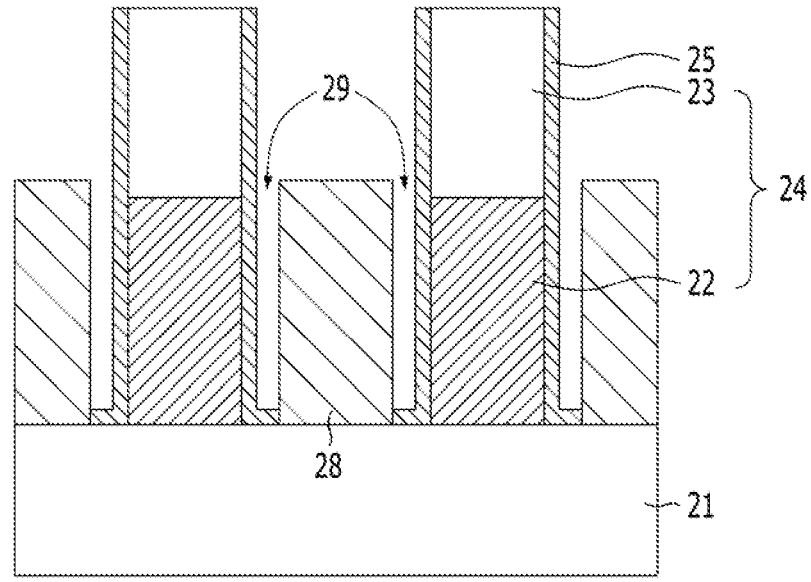
Figure 2G:
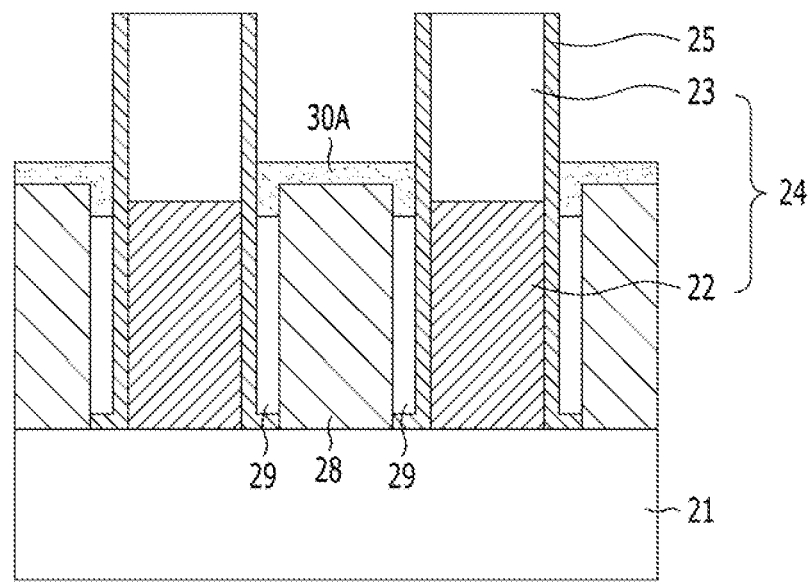
Figure 2H:
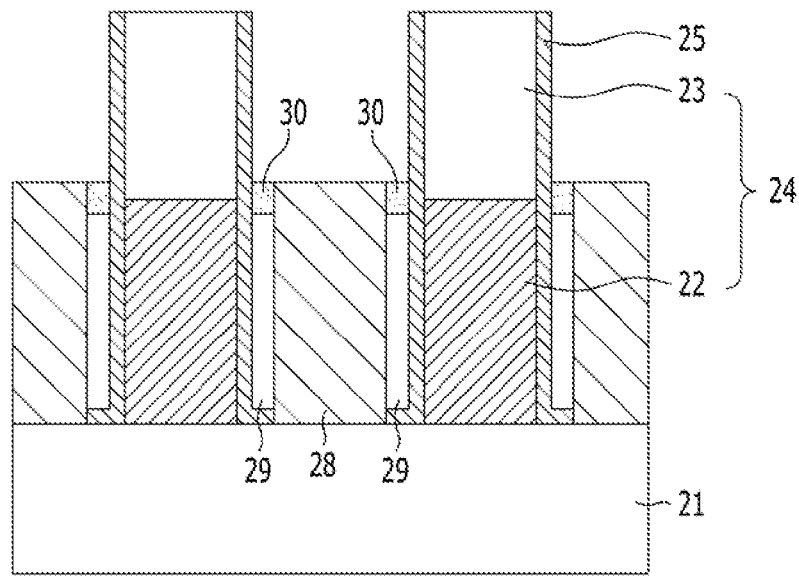
Figure 2I:
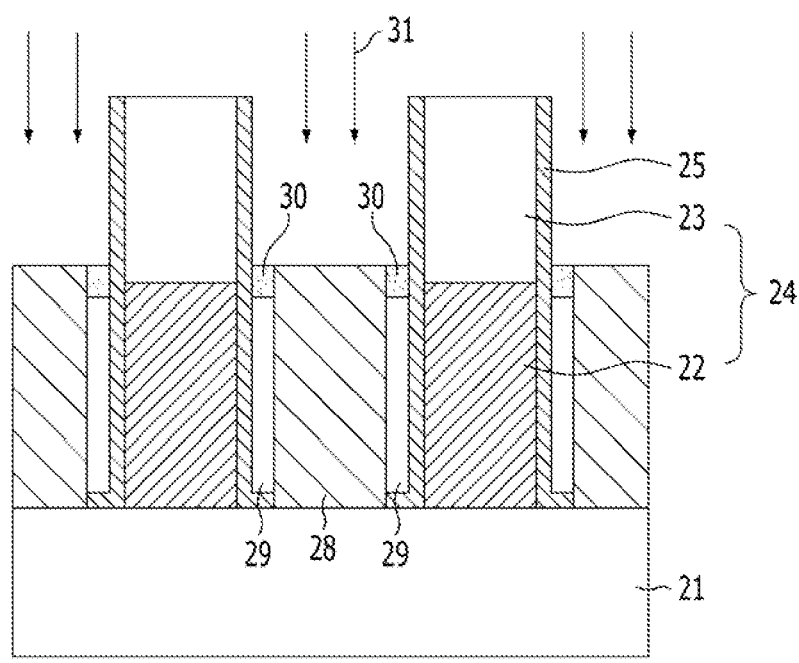
Figure 2J:
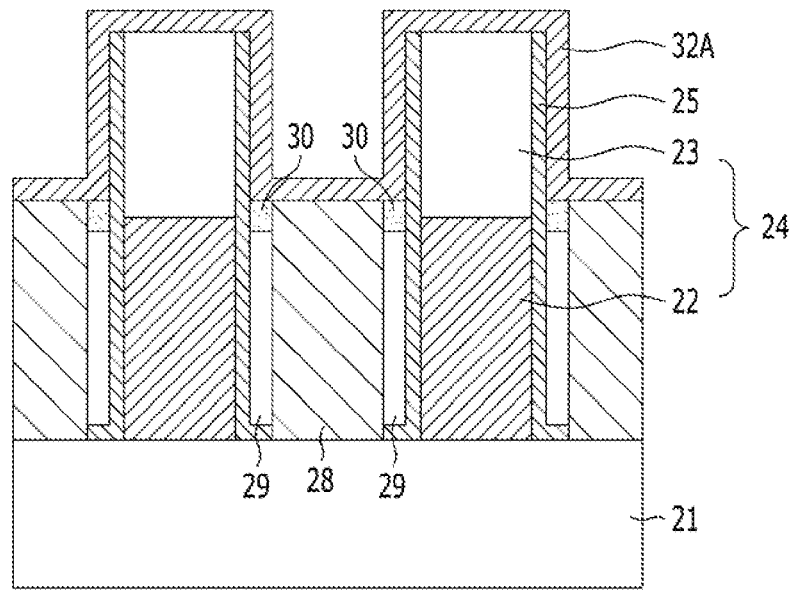
Figure 2K:
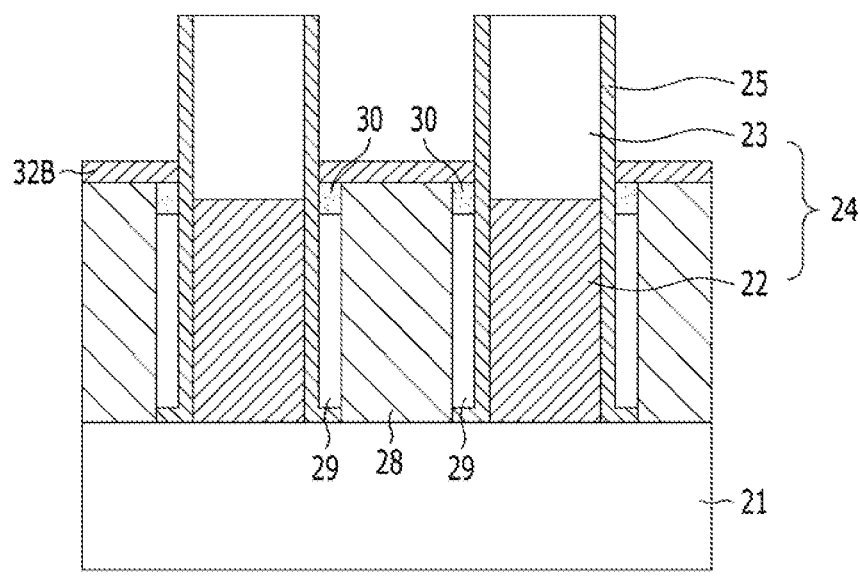
Figure 2L:
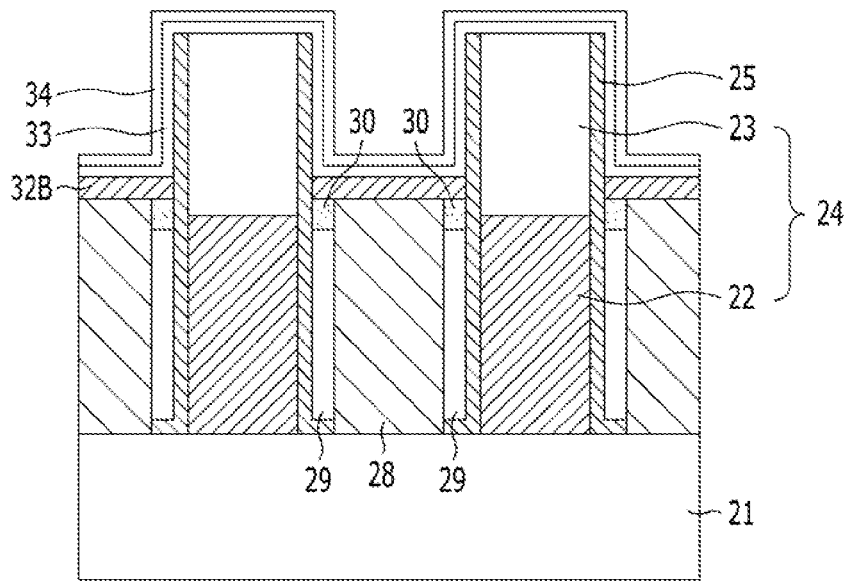
Figure 2M:
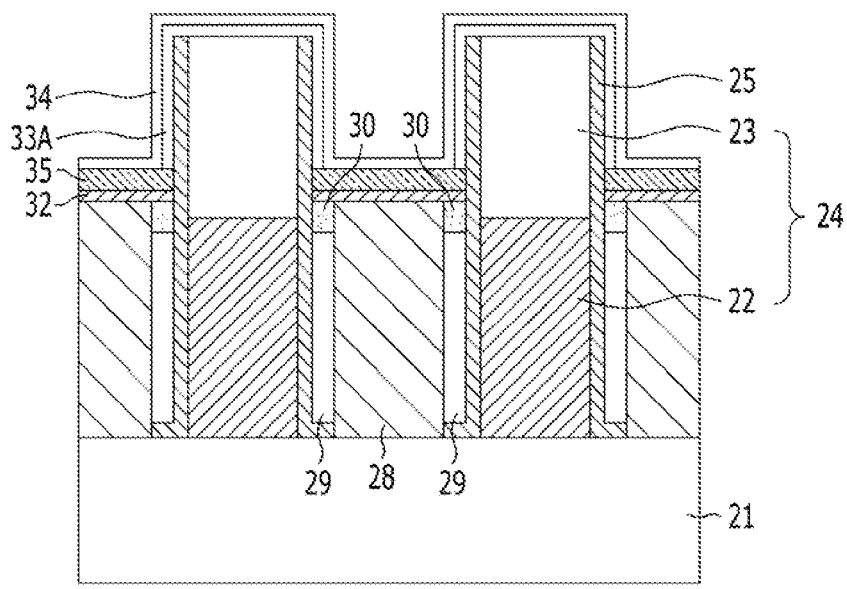
Figure 2N:
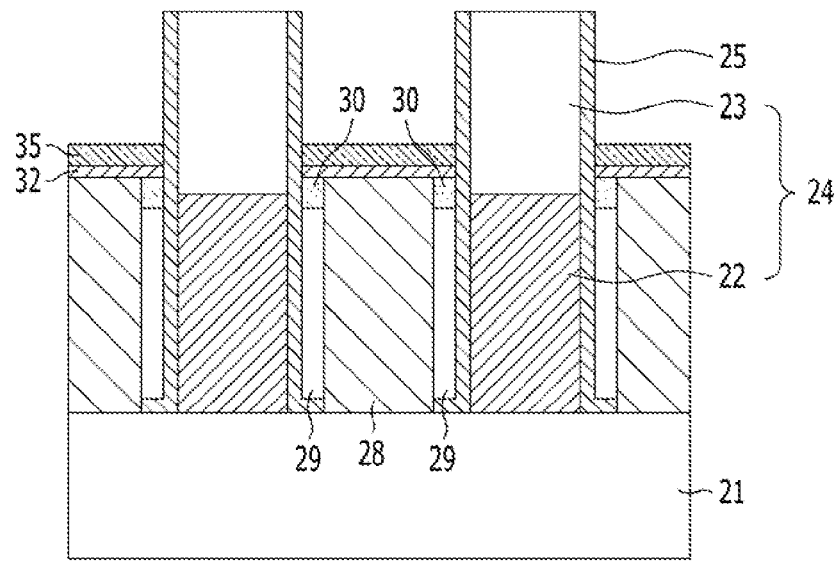
Figure 2O:
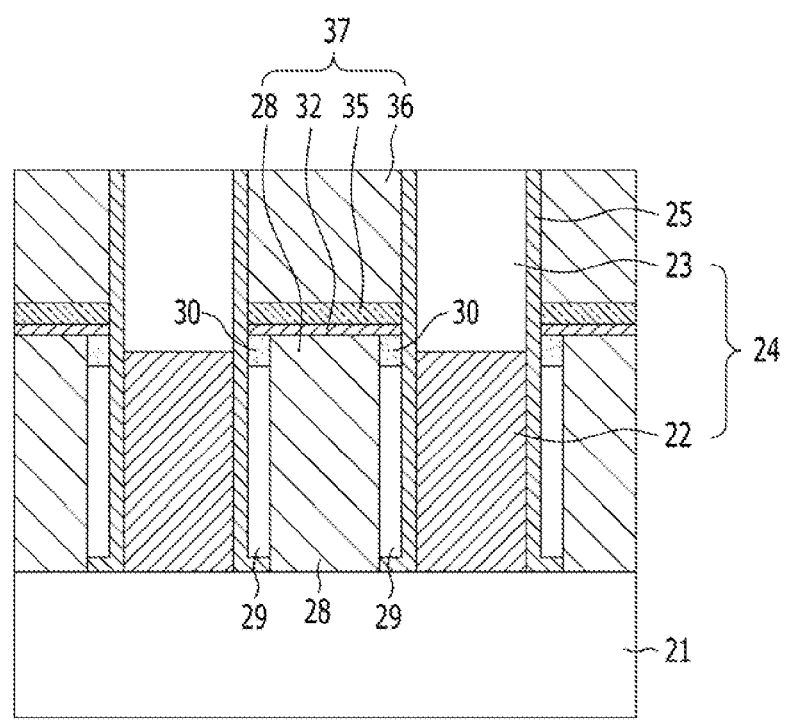

FIGS. 2A to 2O are cross sectional views illustrating a method for fabricating the semiconductor device in accordance with an embodiment of the present invention.

Referring to FIG. 2A, a plurality of first conductive structures 24 are formed over a substrate 21. The substrate 21 may include silicon. The substrate 21 may include a silicon substrate, a silicon germanium substrate or the like. Furthermore, the substrate 21 may include a silicon-on-insulator (SOI) substrate.

The first conductive structures 24 formed over the substrate 21 may be arranged at even intervals from each other in a line shape. In order to form the first conductive structures 24, a hard mask pattern 23 is formed over a first conductive layer. Using the hard mask pattern 23 as an etch mask, the first conductive layer is etched to form a first conductive layer pattern 22. Accordingly, the first conductive structures 24 each having a stacked layer of the first conductive layer pattern 22 and the hard mask pattern 23 are formed. The first conductive layer pattern 22 may include a silicon-containing layer and a metal-containing layer. For example, the first conductive layer pattern 22 may include polysilicon or tungsten. Furthermore, the first conductive layer pattern 22 may be formed by stacking polysilicon and metal. At this time, a barrier layer may be further formed between the polysilicon and the metal. The first conductive layer pattern 22 may include a stacked structure of a polysilicon layer, a titanium-containing layer, and a tungsten layer. The titanium-containing layer may be a barrier layer having a stacked structure of titanium and titanium nitride.

Referring to FIG. 2B, an insulation layer 25A is formed over the entire surface of the resulting structure including the first conductive structures 24. The insulation layer 25A may include nitride or oxide. The insulation layer 25A may include silicon nitride and silicon oxide. The insulation layer 25A is a material becoming a spacer.

A sacrificial layer 26A is formed over the insulation layer 25A. The sacrificial layer 26A is removed to form an air gap during a subsequent process. The sacrificial layer 26A may include a material having an etch selectivity with respect to the insulation layer 25A. The sacrificial layer 26A may include oxide, nitride, or metal nitride. When the insulation layer 25A includes oxide, the sacrificial layer 26A may include metal nitride or nitride. When the insulation layer 25A includes nitride, the sacrificial layer 26A may include oxide or metal nitride. The sacrificial layer 26A may include silicon oxide, silicon nitride, or titanium nitride (TiN).

Referring to FIG. 2C, a double spacer is formed over both sidewalls of the first conductive structure 24. The double spacer may include a spacer 25 and a sacrificial spacer 26. The spacer 25 may be formed by etching the insulation layer 25A. The sacrificial spacer 26 may be formed over the sidewalls of the spacer 25. The sacrificial spacer 26 may be formed by etching the sacrificial layer 26A. In order to form the spacer 25 and the sacrificial spacer 26, an etch-back process may be applied.

As the spacer 25 and the sacrificial spacer 26 are formed, an open portion 27 may be formed to expose the substrate 21 between the first conductive structures 24. In another embodiment after the spacer 25 is formed, an interlayer dielectric layer (not illustrated) may be formed and then etched to form the open portion 27. After the open portion 27 is formed, the sacrificial spacer 26 may be formed over the sidewalls of the open portion 27.

The open portion 27 may be formed to expose the sidewalls of the sacrificial spacer 26. The open portion 27 may have a line shape or a contact hole shape. For example, when the first conductive structure 24 includes a bit line structure, the open portion 27 may include a storage node contact hole.

Referring to FIG. 2D, a second conductive layer 28A is formed to gap-fill the open portion 27. The second conductive layer 28A may include a silicon-containing layer. The second conductive layer 28A may include polysilicon.

Referring to FIG. 2E, the second conductive layer 28A is selectively removed. Accordingly, a recessed second conductive layer pattern 28 is formed between the first conductive structures 24. In order to form the second conductive layer pattern 28, an etch-back process may be applied. The recessed surface of the second conductive layer pattern 28 has a level lower than that of the surface of the first conductive structure 24. The recessed surface of the second conductive layer pattern 28 may be controlled to at least a level greater than that of the top surface of the first conductive layer pattern 22. The second conductive layer pattern 28 may have a height to minimize a facing area with respect to the first conductive layer pattern 22. Accordingly, parasitic capacitance between the first and second conductive layer patterns 22 and 28 may be reduced. The second conductive layer pattern 28 may become a contact plug. When the first conductive structure 24 includes a bit line structure, the second conductive layer pattern 28 may become a part of a storage node contact plug. When the second conductive layer pattern 28 is formed, the spacer 25 and the sacrificial spacer 26 are not etched, because they have an etch selectivity with respect to the second conductive layer pattern 28.

Referring to FIG. 2F, the sacrificial spacer 26 is selectively removed. Accordingly, an air gap 29 is formed. The air gap 29 may be formed over sidewalls of the second conductive layer pattern 28. The air gap 29 is formed between the second conductive layer pattern 28 and the first conductive layer pattern 22. Accordingly, an insulating structure of 'air gap 29-spacer 25' is formed between the first and second conductive layer patterns 22 and 28.

In order to remove the sacrificial spacer 26, a wet etch or dry etch process may be applied. When the sacrificial spacer 26 is removed, the spacer 25, the second conductive layer pattern 28, and the hard mask pattern 23 are not damaged, because they have an etch selectivity with respect to the sacrificial spacer 26. When the sacrificial spacer 26 is titanium nitride, a wet cleaning process using a mixed solution of $H_2SO_4$ and $H_7O_2$ may be performed.

As the air gap 29 is formed parasitic capacitance between the first and second conductive patterns 22 and 28 decreases.

Referring to FIG. 2G, a capping layer 30A is formed over the top surface and a portion of sidewalls of the second conductive layer pattern 28. The capping layer 30A may include an insulator. The capping layer 30A may include oxide of the second conductive layer pattern 28. The capping layer 30A may include silicon oxide. The capping layer 30A may be formed through an oxidation process. Since the second conductive layer pattern 28 includes a silicon-containing layer, silicon oxide may be formed over the top surface and sidewalls of the second conductive layer pattern 28 by the oxidation process. The capping layer 30A may be formed to such a thickness as to block the entrance of the air gap 29. The capping layer 30A may be formed by a plasma oxidation method. At this time, the capping layer 30A is formed to such a thickness as to block the entrance of the air gap 29. When the plasma oxidation method is used to form the capping layer 30A, the top corners of the second conductive layer pattern 28 are quickly oxidized at the same time as the top surface of the second conductive layer pattern 28 is oxidized. When the plasma oxidation method is used, oxidation may not occur on the lower sidewalls of the second conductive layer pattern 28. Therefore, the capping layer 30A may be selectively formed to cover the second conductive layer pattern 28.

As the capping layer 30A is formed, it may be possible to prevent the air gap 29 from being opened during a subsequent process.

Referring to FIG. 2H, the capping layer 30A is selectively removed to expose the top surface of the second conductive layer pattern 28. Accordingly, a capping layer pattern represented by reference numeral '30' is left on the upper sidewalls of the second conductive layer pattern 28. The capping layer pattern 30 caps the air gap 29 such that the top surface of the second conductive layer pattern 28 is exposed. In order to be the capping layer pattern 30 left, a wet etch process may be applied. Since the capping layer pattern 30 includes silicon oxide, a hydrofluoric acid-based chemical may be used.

Referring to FIG. 2I an ion implant process 31 is performed. The ion implant process 31 may be performed over the second conductive layer pattern 28. Accordingly, contact resistance may be improved. During the ion implant process 31 an NI-type dopant or F-type dopant may be implanted. The ion implant process 31 may be performed after a protective layer is subsequently formed.

Referring to FIG. 2J, a protective layer 32A is formed. In other words, the protective layer 32A is conformally formed over the entire surface of the resulting structure including the second conductive layer pattern 28, the capping layer pattern 30, and the first conductive structure 24. The protective layer 32A may include a conductive material. The protective layer 32A may include a silicon-containing layer. The protective layer 32A may include a silicidable material, that is, a first silicidable material. A polysilicon layer may be formed as the protective layer 32A. When the protective layer 32A is formed, a polysilicon layer structure having a double layer structure of the protective layer 32A and the second conductive layer pattern 28 may be formed. The thickness of the protective layer 32A may be controlled in such a manner that the protective layer 32A is in left to a predetermined thickness even through a subsequent silicidation reaction occurs.

Referring to FIG. 2K, the protective layer 32A is selectively removed. For this operation, an etch-back process may be performed. A protective layer 32B is left on the second conductive layer pattern 28 and the capping layer pattern 30 by the etch-back process. The protective layer 32B may prevent a loss of the capping layer pattern 30 during a subsequent process such that the capping layer pattern 30 stably caps the air gap 29.

Referring to FIG. 2L, a second silicidable material 33 and an anti-oxidation layer 34 are formed over the entire surface of the resulting structure including the protective layer 32B. The second silicidable material 33 may include a silicidable metal layer. The second silicidable material 33 may include cobalt. The anti-oxidation layer 34 serves to prevent the second silicidable material from being oxidized during a subsequent silicidation reaction process. The anti-oxidation layer 34 may be formed by stacking titanium and titanium nitride.

Referring to FIG. 2M, an ohmic contact layer 35 is formed. The ohmic contact layer 35 may include metal silicide. In order to form the ohmic contact layer 35, an annealing process may be performed. Through the annealing process, metal of the second silicidable material 33 and silicon of the protective layer 32B may react to form metal silicide. The metal silicide may include cobalt silicide. In this embodiment, the metal silicide may include cobalt silicide with 'CoSi$_2$ phase'. As the cobalt silicide with 'CoSi$_2$ phase' is formed as the metal silicide, contact resistance may be improved. Simultaneously, low-resistance cobalt silicide may be sufficiently formed even in a small area of the open portion 27 having a minute critical dimension (CD). Since the protective layer 32B and the second silicidable material 33 react with each other to form the metal silicide, the formation area of the metal silicide may be increased. As the formation area of the metal silicide is increased, contact resistance may be improved. Furthermore since the protective layer 32B is used as a buffer to form the metal silicide, the metal silicide may prevent from being diffused into the second conductive layer pattern 28.

After the ohmic contact layer 35 is formed, the protective layer may be left with a predetermined thickness, as represented by reference numeral '32'. Furthermore, the unreacted second silicidable material layer may be left as represented by reference numeral '33A'.

Referring to FIG. 2N, the anti-oxidation layer 34 is removed, and the unreacted and left second silicidable material layer 33A are then removed. When the unreacted second silicidable material layer 33A is not removed, metal atoms of the unreacted second silicidable material layer 33A may be diffused downward or cause an abnormal reaction of the metal silicide, during a subsequent process. Therefore, the unreacted second silicidable material layer 33A is removed. The unreacted second silicidable material layer 33A may be removed through a cleaning process using a wet chemical. For example, when the unreacted second silicidable material layer 33A is cobalt, chemicals based on H$_2$SO$_4$ (SPM) and NH$_4$OH (SC-1) may be used. More specifically, de-ionized (DI) water is used to oxidize the unreacted cobalt, the chemical based on H$_2$SO$_4$ (SPM) is used to primarily remove the oxidized unreacted cobalt, and the chemical based on NH$_4$OH (SC-1) is used to secondarily remove metal polymer-based residue. The wet chemicals may be used to remove the metal polymer as well as the unreacted cobalt.

When the unreacted second silicidable material layer 33A is stripped as described above, the capping layer pattern 30 and the air gap 29 may be protected by the protective layer 32.

Referring to FIG. 2O, a third conductive layer pattern 36 is formed over the ohmic contact layer 35. In order to form the third conductive layer pattern 36, a third conductive layer may be formed to gap-fill the space over the ohmic contact layer 35, and a planarizing process may be then performed. The third conductive layer pattern 36 may include a metal-containing layer. The third conductive layer pattern 36 may include tungsten. Although not illustrated, the third conductive layer pattern 36 may further include a barrier layer. Therefore, the third conductive layer pattern 36 may be formed by stacking a barrier layer and a metal-containing layer. The barrier layer may include a titanium-containing material. The barrier layer may include a single layer of titanium or a stacked layer of titanium and titanium nitride.

When the third conductive layer pattern 36 is formed in such a manner, a second conductive structure 37 including the second conductive layer pattern 28, the protective layer 32, the ohmic contact layer 35 and the third conductive layer pattern 36 is formed. Between the first and second conductive structures 24 and 37, the air gap 29 is formed. The second conductive structure 37 may become a storage node contact plug. The second conductive layer pattern 28 may become a bottom plug of the storage node contact plug, and the third conductive layer pattern 36 may become a top plug of the storage node contact plug. Since the second conductive layer pattern 28 includes a silicon-containing layer and the third conductive layer pattern 36 includes a metal-containing layer, a contact plug including the silicon-containing layer and the metal-containing layer, that is a semi-metal contact plug structure may be formed.

The air gap 29 may be formed between the first and second conductive layer patterns 22 and 28. When the first conductive layer pattern 22 includes a bit line and the second conductive layer pattern 28 includes a storage node contact plug, the air gap 29 may be formed between the bit line and the storage node contact plug. When the first conductive layer pattern 22 includes a gate electrode and the second conductive layer pattern 28 includes a contact plug, the air gap 29 may be formed between the gate electrode and the contact plug.

Figure 3A:
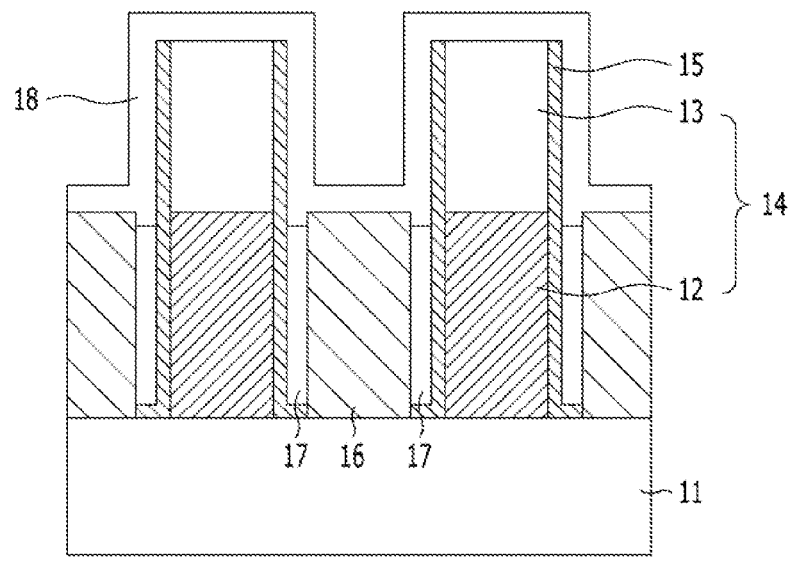
FIGS. 3A and 3B illustrate a first comparative embodiment for an embodiment of the present invention.
Figure 3B:
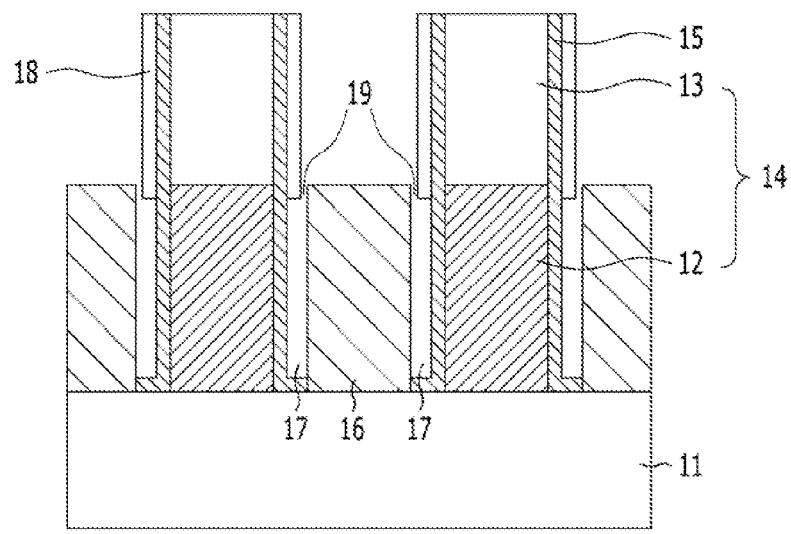

FIGS. 3A and 3B illustrate a first comparative embodiment for the embodiment of the present invention.

Referring to FIGS. 3A and 3B, a plurality of first conductive structures 14 each having a stacked layer of a first conductive layer 12 and a hard mask layer 13 are formed over a substrate 11, and a second conductive layer 16 of a second conductive structure is formed between the first conductive structures 14. An air gap 17 is formed between the first conductive structure 14 and the second conductive layer 16. A spacer 1 is formed over the sidewalls of the first conductive structure 14.

In the first comparative embodiment, a single insulator may be used as a capping layer 18. The capping layer 18 may be formed of silicon nitride or silicon oxide. As the insulator is used as the capping layer 18, the capping layer 18 may be selectively removed from the surface of the second conductive layer 16, in order to perform a subsequent process.

However, when the capping layer 18 is attacked during the subsequent process, a self-aligned contact (SAC) fall may occur. When the capping layer 18 is formed with a large thickness so as to stably form the air gap 17, the formation area of metal silicide may be significantly reduced. In this case, contact resistance may considerably increase.

In particular, when the capping layer 18 is separately formed, a problem may occur. More specifically, when the capping layer 18 is etched to open the top of the second conductive layer 16 in order to form metal silicide, the capping layer 18 may be attacked to open the air gap 17 (as referred to as reference numeral '19').

Figure 4A:
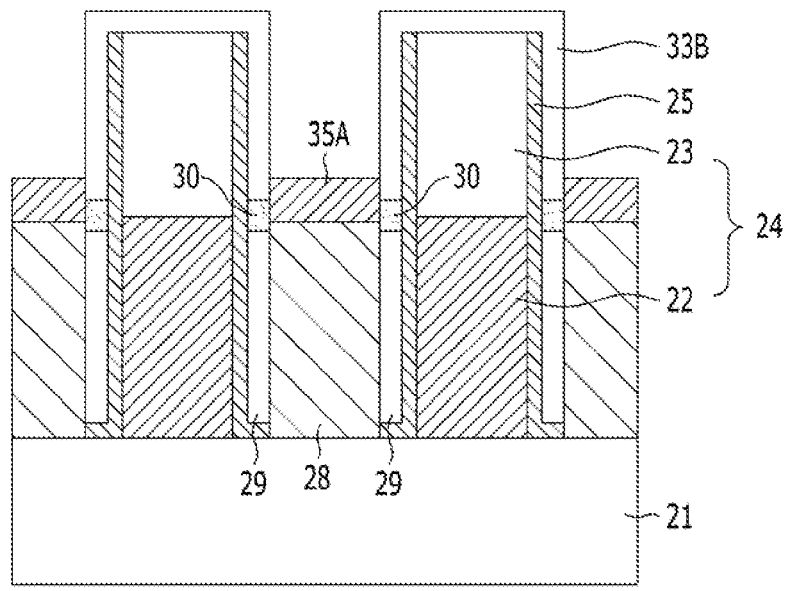
FIGS. 4A to 4C illustrate a second comparative embodiment or an embodiment of the present invention.
Figure 4B:
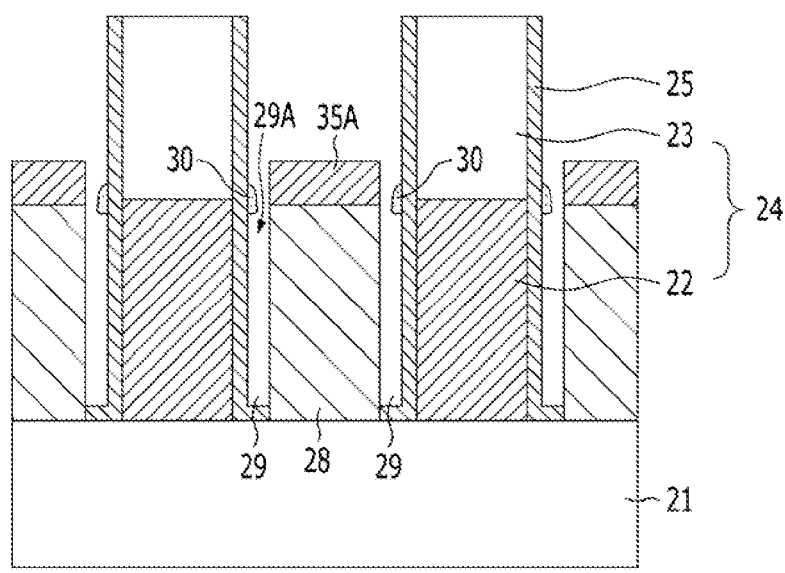
Figure 4C:
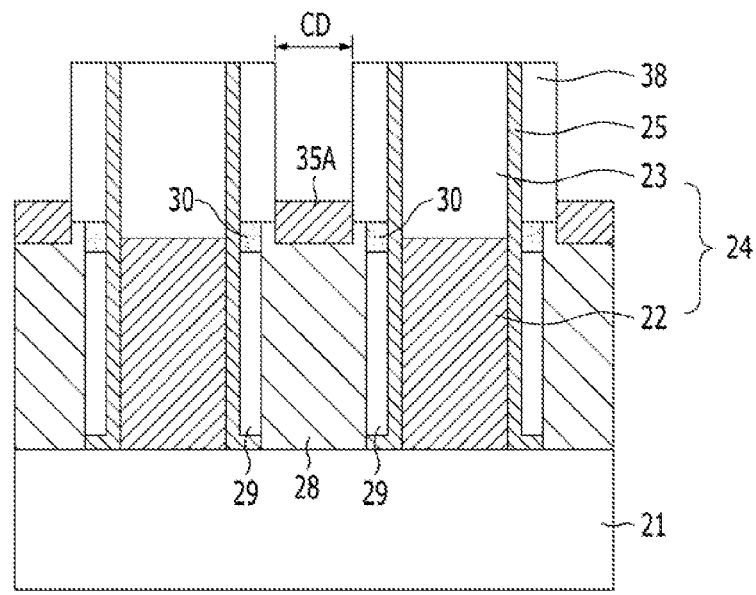

FIGS. 4A to 4C illustrate a second comparative embodiment for the embodiment of the present invention.

Referring to FIG. 4A, a capping layer pattern 30 is left to expose the top surface of a second conductive layer pattern 28 (as referred to as FIG. 2H).

Then, a cobalt layer 33S is deposited on the entire surface of the resulting structure, and an annealing process is performed to form cobalt silicide 35A. Through the annealing process, the second conductive layer pattern 28 and the cobalt layer 33B react with each other to form the cobalt silicide 35A.

Referring to FIG. 4B, the unreacted and left cobalt layer 33B is stripped.

In the second comparative embodiment, however, when the unreacted cobalt layer is stripped, the capping layer pattern 30 may be attacked and lost. Accordingly, an air gap 29 may be opened (as referred to as reference numeral '29A'). In accordance with the second comparative embodiment, it may be difficult to stably cap the air gap 29. Furthermore, since the second conductive layer pattern 28 and the cobalt layer 33B are directly reacted with each other without a protective layer, the formation area of the cobalt silicide 35A may decrease.

In order to prevent the capping layer pattern 30 from being attacked, an insulating capping layer 38 may be further formed before the cobalt layer is deposited, as illustrated in FIG. 4C. In this case, the formation area of the cobalt silicide 35A may be reduced to significantly increase contact resistance. In other words, the insulating capping layer 38 may be formed with a large thickness to protect the capping layer 30. Accordingly, the top CD of the open portion may be reduced. Therefore, since a contact area of the cobalt layer 33B reacting with the second conductive layer pattern 28 is reduced, the cobalt silicide 35A may have a small area. Accordingly, since the contact area between the second conductive layer pattern 28 and the cobalt silicide 35A serving as an ohmic contact layer is reduced, there may be a limitation in improving contact resistance.

In the embodiment of the present invention, however, since the protective layer 32 is formed over the capping layer pattern 30, the air gap 29 may be stably capped during a subsequent process. Furthermore, since the ohmic contact layer 35 is formed through the reaction of the second silicidable material 33 with the protective layer 32, contact resistance may be improved.

Figure 5A:
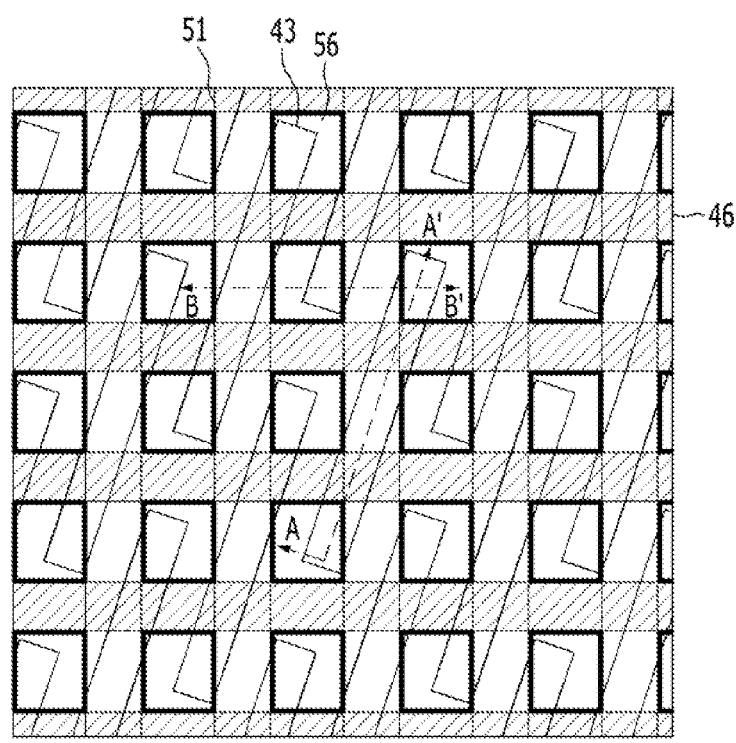
FIG. 5A is an arrangement diagram illustrating memory cells of DRAM.
Figure 5B:
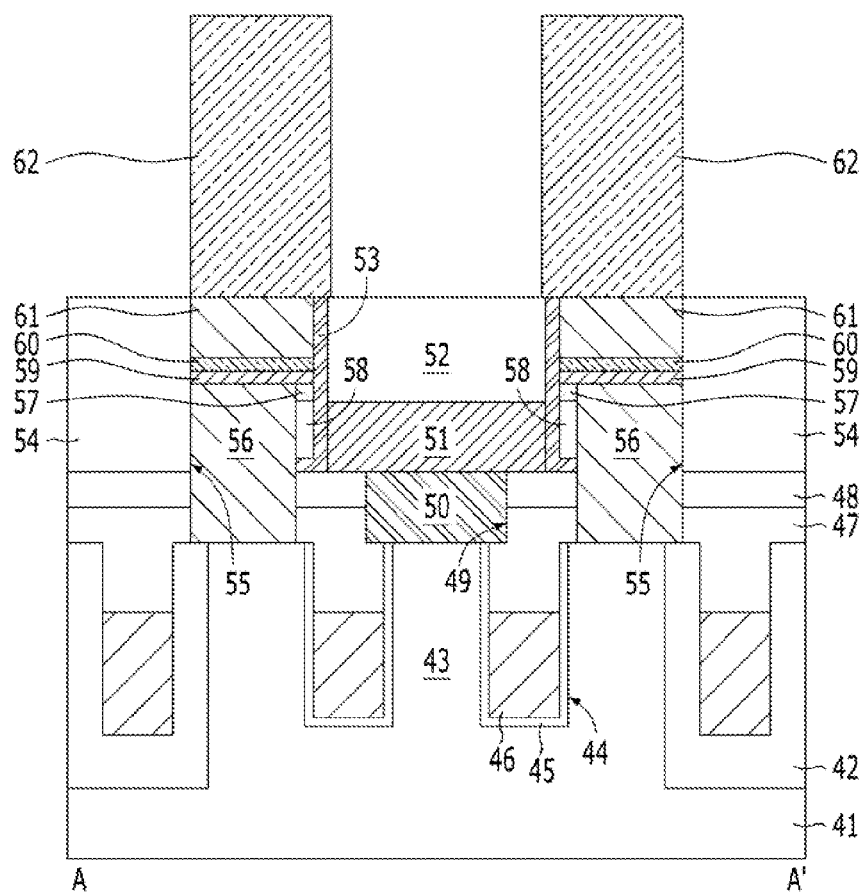
FIG. 5B is a cross-sectional view of the DRAM taken along line A-A' of FIG. 5A.
Figure 5C:
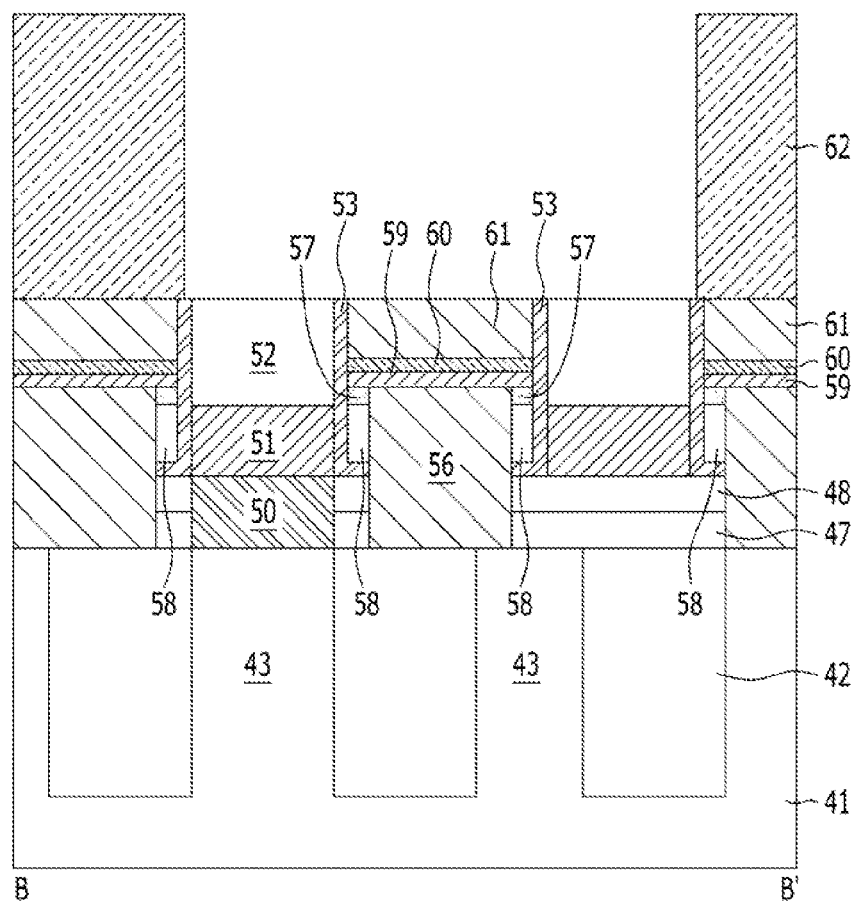
FIG. 5C is a cross sectional view of the DRAM taken along line B-B' of FIG. 5A.

FIG. 5A is an arrangement diagram illustrating memory cells of DRAM. FIG. 5B is a cross-sectional view of the DRAM taken along line A-A' of FIG. 5A. FIG. 5C is a cross-sectional view of the DRAM taken along line B-B' of FIG. 5A.

Referring to FIGS. 5A to 5C an active region 43 is defined by an isolation region 42 in a substrate 41. A buried gate electrode 46 is formed in a trench 44 crossing the active region 43 and the isolation region 42. A bit line 51 extended in a direction crossing the buried gate electrode 46 is formed over the substrate 41, and connected to the active region 43 through a bit line contact plug 50. Accordingly, a storage node contact plug connected to the active region 43 is formed. The storage node contact plug may include a first storage node contact plug 56, a protective layer 59, an ohmic contact layer 60, and a second storage node contact plug 61, which are stacked therein. A storage node 62 of a capacitor is formed over the second storage node contact plug 61.

in accordance with the embodiment of the present invention, the storage node contact plug may correspond to the second conductive structure and the bit line may correspond to the first conductive layer pattern of the first conductive structure. Therefore, an air gap 58 may be formed between the first storage node contact plug 56 and the bit line 51. The protective layer 59 may include polysilicon, and the ohmic contact layer 60 may include metal silicide.

The air gap 58 is capped by a capping layer 57, and the protective layer 59 is formed over the capping layer 57 and the first storage node contact plug 56. The capping layer 57 may correspond to the capping layer in accordance with the embodiment of the present invention. Therefore, the capping layer 57 may include silicon oxide. The protective layer 59 may correspond to the protective layer in accordance with the embodiment of the present invention. Therefore, the protective layer 59 may include polysilicon. The ohmic contact layer 60 may include cobalt silicide.

Referring to FIGS. 5A to 5C, a method for fabricating a memory cell will be described as follows.

The substrate 41 may include a semiconductor material. The substrate 41 may include a semiconductor substrate. The substrate 41 may include a silicon substrate. For example, the substrate 41 may include a single crystal silicon substrate. The isolation region 42 may be formed through a shallow trench isolation (STI) process. The active region 43 may be defined by the isolation region 42. The isolation region 42 may include a wall oxide, a liner, and a gap-fill material, which are segue daily formed. The liner may include silicon nitride and silicon oxide. The silicon nitride may include $Si_3N_4$, and the silicon oxide may include $SiO_2$. The gap-fill material may include silicon oxide such as spin-on dielectric (SOD). Furthermore, the gap-fill material may include silicon nitride. At this time, the silicon nitride used as the liner may be used to perform a gap-fill operation.

The trench 44 may be formed in both of the active region 43 and the isolation region 42. The trench 44 of the isolation region 42 may be formed to a larger depth than the trench 44 of the active region 43, due to a difference in etch rate between the active region 43 and the isolation region 42.

Before the buried gate electrode 46 is formed, a gate dielectric layer 45 may be formed over the surface of the trench 44. The buried gate electrode 46 may be formed by forming a metal-containing layer to gap-fill the trench 44 and then performing an etch-back process. The metal-containing layer may include a material with a metal such as titanium, tantalum, or tungsten. The metal-containing layer may include at least any one selected from the group consisting of tantalum nitride (TaN), titanium nitride (TiN), tungsten nitride (WN), and tungsten (W). For example, the buried gate electrode 46 may have a single layer structure of TiN, TaN, or W, or a two-layer structure of TiN/W or TaN/W formed by stacking W over TiN or TaN. Furthermore, the buried gate electrode 46 may have a two-layer structure of WN/W in which W is stacked over WN. In addition, the buried gate electrode 46 may include a low-resistance metal material.

A sealing layer 47 is formed over the buried gate electrode 46. The sealing layer 47 may gap-fill the trench 44 over the buried gate electrode 46. The sealing layer 47 may serve to protect the buried gate electrode 46 during a subsequent process. The sealing layer 47 may include an insulating material. The sealing layer 47 may include silicon nitride.

A first interlayer dielectric layer 48 is formed. The first interlayer dielectric layer 48 and the sealing layer 47 are then etched to form a bit line contact hole 49. A bit line contact plug 50 is formed by burying a conductive layer in the bit line contact hole 49. A bit line structure including a bit line 51 and a bit line hard mask layer 52 is formed over the bit line contact plug 50. The bit line contact plug 50 may include a polysilicon layer or a metal-containing layer. The bit line 51 may include tungsten or a barrier layer of Ti/TiN and tungsten over the barrier layer. The bit line hard mask layer 62 may include silicon nitride.

A spacer 53 is formed over both sidewalls of the bit line structure. Then, a second interlayer dielectric layer 54 is formed, and the second interlayer dielectric layer 54, the first interlayer dielectric layer 48, and the sealing layer 47 are then etched to form a storage node contact hole 55. A sacrificial spacer (not illustrated) is formed over the sidewalls of the storage node contact hole 55, and a first storage node contact plug 56 is formed and recessed in the storage node contact hole 55. Then, the sacrificial spacer is removed to form the air gap 58.

Then, the surface of the first storage node contact plug 56 is oxidized to form the capping layer 57, and the capping layer 57 is selectively removed to expose the surface of the first storage node contact plug 56. The air gap 58 is capped by the capping layer 57.

A protective layer 59 is formed over the first storage node contact plug 56 and the capping layer 57. The protective layer 59 may include polysilicon.

An ohmic contact layer 60 is formed over the protective layer 59. The ohmic contact layer 60 may be formed by forming a silicidable metal layer over the protective layer 59 and then performing an annealing process. The ohmic contact layer 60 may include metal silicide. The ohmic contact layer 60 may include cobalt silicide.

A second storage node contact plug 61 is formed over the ohmic contact layer 60. The second storage node contact plug 61 may include a metal-containing layer. The second storage node contact plug 61 may include tungsten.

A storage node 62 of a capacitor is formed over the second storage node contact plug 61. The storage node 62 may have a cylinder shape. In another embodiment, the storage node 62 may have a pillar shape. Although not illustrated, a dielectric layer and a plate node may be further formed over the storage node 62.

The semiconductor device in accordance with the above-described embodiments of the present invention may be applied to DRAM (Dynamic Random Access Memory). Without being limited thereto, however, the semiconductor device may be applied to SRAM (Static Random Access Memory), flash memory, FeRAM (Ferroelectric Random Access Memory), MRAM (Magnetic Random Access Memory), PRAM (Phase Change Random Access Memory) or the like.

Figure 6:
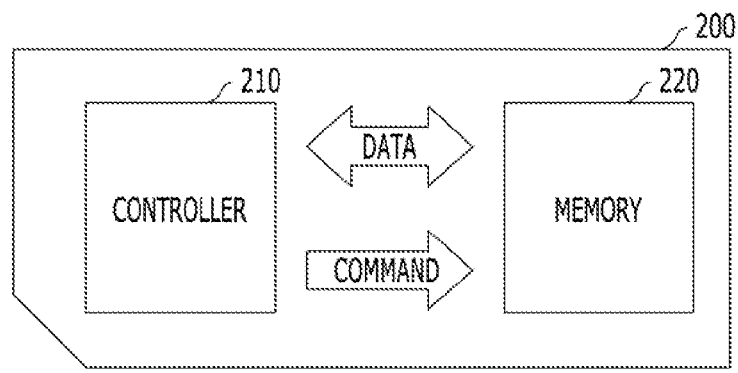
FIG. 6 is a schematic diagram of a memory card.

FIG. 6 is a schematic diagram of a memory card. Referring to FIG. 6, the memory card 200 may include a controller 210 and a memory 220. The controller 310 and the memory 320 may exchange electrical signals. For example, the memory 220 and the controller 210 may exchange data according to a command of the controller 210. Accordingly, the memory card 200 may store data in the memory 220, or output data to the outside from the memory 220. The memory 220 may include the above-described air gap and plugs. The memory card 200 may be used as data storage media of various portable devices. For example, the memory card 200 may include a memory stick card, a smart media card (SM), a secure digital card (SD), a mini secure digital card (mini SD), or a multi-media card (MMC).

Figure 7:
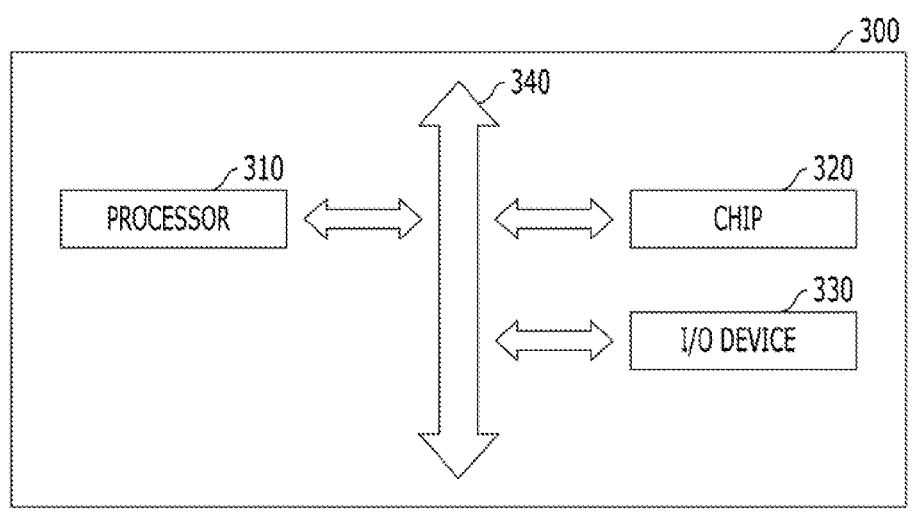
FIG. 7 is a block diagram illustrating an electronic system.

FIG. 7 is a block diagram illustrating an electronic system. Referring to FIG. 7, the electronic system 300 may include a processor 310, an input/output device 330, and a chip 320, which perform data communication through a bus 340. The processor 310 serves to perform a program operation and control the electronic system 300. The input/output device 330 may be used to input or output data of the electronic system 300. The electronic system 300 may be connected to an external device, for example, a personal computer or network, and exchange data with the external device through the input/output device 330. The chip 320 may store codes and data for the operation of the processor 310, and may process a part of operations assigned by the processor 310. For example, the chip 320 may include the above-described air gap and plugs. The electronic system 300 may form various electronic control devices requiring the chip 320. For example, the electronic system 300 may be applied to a mobile phone, an MP3 player, a navigation system, a solid state disk (SSD), or household appliances.

In accordance with the embodiments of the present invention, as the air gap is formed between the conductive structures, parasitic capacitance may be reduced by a low dielectric constant of the air gap.

Furthermore, as the protective layer is formed over the capping layer, the air gap may be stably implemented without a loss of the capping layer.

Furthermore, as the ohmic contact layer is formed over the protective layer, the formation area of the ohmic contact layer may be increased to improve contact resistance.

Although various exemplary embodiments of the present invention have been described for illustrative purposes, it will be apparent to those skilled in the art that various changes and modifications may be made without departing from the spirit and scope of the invention as defined in the following claims.

What is claimed is:

1. A method for fabricating a semiconductor device, comprising:

forming a semiconductor structure having an open portion over a substrate;

forming a sacrificial spacer on a sidewall of the open portion;

forming a first plug in the open portion;

removing the sacrificial spacer to form an air gap;

forming a capping layer to expose a top surface of the first plug and to cap the air gap;

forming a protective layer over the capping layer and the first plug;

forming an ohmic contact layer over the protective layer; and forming a second plug over the ohmic contact layer.

2. The method of claim 1, wherein the forming of a capping layer comprises:

forming oxide by oxidizing the surface of the first plug; and selectively removing the oxide to expose the top surface of the first plug.

3. The method of claim 1, wherein the first plug is formed of a silicon containing material, and the capping layer is formed of oxide of the silicon containing material.

4. The method of claim 1, wherein the first plug is formed of polysilicon, and the capping layer is formed of silicon oxide obtained by oxidizing the polysilicon.

5. The method of claim 1, wherein the forming of a protective layer comprises:

forming a polysilicon layer on an entire surface of the resulting structure including the capping layer and the first plug; and etching back the polysilicon layer.

6. The method of claim 1, wherein the forming of an ohmic contact layer comprises:

forming a silicidable material layer over the protective layer;

performing an annealing process to react the protective layer and the silicidable metal layer, and forming metal silicide; and removing the remaining unreacted silicidable metal layer.

7. The method of claim 6, wherein the silicidable metal layer comprises cobalt.

8. The method of claim 1, wherein the first plug comprises polysilicon, and the second plug comprises a metal-containing material.

9. A method for fabricating a semiconductor device, comprising:

forming a plurality of bit line structures over a substrate;

forming a storage node contact hole between the bit line structures;

forming a sacrificial spacer on a sidewall of the storage node contact hole;

forming a first storage node contact plug in the storage node contact hole;

removing the sacrificial spacer to form an air gap;

forming oxide by oxidizing the surface of the first storage node contact plug;

etching the oxide to expose a top surface of the first storage node contact plug, and to form a capping layer to cap the air gap;

forming a protective layer over the capping layer and the first storage node contact plug;

forming an ohmic contact layer over the protective layer; and forming a second storage node contact plug over the ohmic contact layer.

10. The method of claim 9, wherein the forming of a protective layer comprises:

forming a polysilicon layer on an entire surface of the resulting structure including the capping layer and the first storage node contact plug; and etching back the polysilicon layer.

11. The method of claim 9, wherein the forming of an ohmic contact layer comprises:

forming a silicidable metal layer over the protective layer;

performing an annealing process to react the protective layer and the silicidable metal layer, and forming metal silicide; and stripping the remaining unreacted silicidable metal layer.

12. The method of claim 11, wherein the silicidable metal layer comprises cobalt.

13. The method of claim 9, wherein the first storage node contact plug is formed of polysilicon, and the oxide is formed of silicon oxide obtained by oxidizing the polysilicon.

14. The method of claim 9, wherein the first storage node contact plug comprises polysilicon, and the second plug comprises a metal-containing material.

15. The method of claim 9, further comprising:

ion-implanting a dopant into the top surface of the first storage node contact plug after the forming of a capping layer.

16. A method for fabricating a semiconductor device, comprising:

forming a semiconductor structure having an open portion exposing a portion of a substrate;

forming a sacrificial spacer on a sidewall of the semiconductor structure;

forming a first plug in the open portion;

removing the sacrificial spacer to form an air gap between the first plug and the sidewall of the open portion;

forming a capping layer to expose a top surface of the first plug and to cap the air gap;

forming a protective layer over the capping layer and the first plug; and forming a second plug over the protective layer.

17. The method of claim 16, wherein the forming of a capping layer comprises:

forming oxide by oxidizing the surface of the first plug; and selectively removing the oxide to expose the top surface of the first plug.

18. The method of claim 16, wherein the forming of a second plug comprises:

forming an ohmic contact layer over the protective layer; and forming the second plug over the ohmic contact layer.

* * * * *